United States Patent
Perniola et al.

(10) Patent No.: US 8,693,232 B2
(45) Date of Patent: Apr. 8, 2014

(54) NON-VOLATILE MEMORY CELL INCLUDING A RESISTIVITY CHANGE MATERIAL

(75) Inventors: Luca Perniola, Noyarey (FR); Stefania Braga, Ziano Piacentino (IT)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 146 days.

(21) Appl. No.: 13/152,955

(22) Filed: Jun. 3, 2011

(65) Prior Publication Data
US 2012/0307546 A1    Dec. 6, 2012

(51) Int. Cl.
G11C 11/00    (2006.01)
(52) U.S. Cl.
USPC ............... 365/148; 365/163; 365/175; 257/2
(58) Field of Classification Search
USPC ................ 365/148, 163, 175, 171; 257/2, 4
See application file for complete search history.

(56) References Cited

U.S. PATENT DOCUMENTS

| | | | | |
|---|---|---|---|---|
| 7,339,813 B2* | 3/2008 | Hsu | ............................... | 365/148 |
| 7,372,725 B2* | 5/2008 | Philipp et al. | ................. | 365/163 |
| 7,706,177 B2* | 4/2010 | Petti | .............................. | 365/163 |
| 7,902,538 B2* | 3/2011 | Lung | ................................ | 257/4 |
| 7,943,918 B2* | 5/2011 | Park et al. | .......................... | 257/2 |

OTHER PUBLICATIONS

U.S. Appl. No. 13/152,197, filed Jun. 3, 2011, Perniola, et al.
U.S. Appl. No. 13/152,955, filed Jun. 3, 2011, Perniola, et al.
D.-H. Kang, et al., "Two-bit Cell Operation in Diode-Switch Phase Change Memory Cells with 90nm Technology", IEEE, 2008, pp. 98-99.
T. Nirschl, et al., "Write Strategies for 2 and 4-bit Multi-Level Phase-Change Memory" IEEE, 2007, pp. 461-464.
Ki-Hong Kim, et al. "Changes in Chemical and Structural Properties of Phase-Change Material GeTe with Nitrogen Doping and Annealing" Japanese Journal of Applied Physics, vol. 49, 2010, pp. 061801-1-061801-4.
Luca Perniola, et al., "Electrical Behavior of Phase-Change Memory Cells Based on GeTe", IEEE Electron Device Letters, vol. 31, No. 5, May 2010, pp. 488-490.
A. Fantini, et al., "N-doped GeTe as Performance Booster for Embedded Phase-Change Memories", Electron Devices Meeting, IEEE International, Dec. 2010, pp. 1-4.
Y. H. Shih, et al., "Mechanisms of Retention Loss in $Ge_2Sb_2Te_5$-based Phase-Change Memory" Electron Devices Meeting, IEEE International, Dec. 2008, 2 pages.
Guo-Fu Zhou, "Materials aspects in phase change optical recording", Materials Science and Engineering, 2001, pp. 73-80.
Motoyasu Terao, et al., "Electrical Phase-Change Memory: Fundamentals and State of the Art", Japanese Journal of Applied Physics, vol. 48, 2009, pp. 080001-1-080001-14.

* cited by examiner

*Primary Examiner* — Son Dinh
(74) *Attorney, Agent, or Firm* — Oblon, Spivak, McClelland, Maier & Neustadt, L.L.P.

(57) ABSTRACT

A non-volatile memory cell including a resistivity change material configured to reversibly change state between at least two stable states having different electrical resistances and conformed such that transformation from one state to another is obtained by controlling the temperature increase or decrease of the resistivity change material, wherein the resistivity change material has an ohmic component $R_{on\text{-}mat}$ defined by the ratio between an increment in the programming voltage $V_{prog}$ causing an increment in a programming current $I_{prog}$, wherein the resistivity change material has a non-ohmic component defined by a maintenance voltage $V_h$ such that $V_h$ is greater than zero when the programming voltage $I_{prog}$ passes through the resistivity change material (22); and greater than an ohmic voltage equal to $R_{on\text{-}mat} \times I_{prog}$.

26 Claims, 5 Drawing Sheets

Prior Art

NON-VOLATILE MEMORY CELL INCLUDING A RESISTIVITY CHANGE MATERIAL

TECHNICAL FIELD OF THE INVENTION

The present invention concerns non-volatile resistance change memories in general and describes more specifically a memory cell in which several resistance levels may be programmed.

STATE OF THE ART

Resistance change memories use a material which is capable of reversibly switching between an amorphous state and a crystalline state and also among different crystalline states under the effect of heat. These various states display different electrical resistances. The amorphous state is more resistant that the various crystalline states.

A challenge common to all the microelectronic devices produced for decades now is the need to have to constantly increase their integration density and therefore the quality of the stored data. In the field of memories, a highly effective means of obtaining more dense devices is to be able to program more than two levels in each memory cells, i.e. to be able to store more than one bit of data in the latter in order to increase their capacity without requiring a corresponding reduction in their size. For example, programming of four levels of electrical resistance in the case of resistive phase-change memories makes it possible to double the memory capacity by allowing storage of two bits of data in each physical cell.

It is expedient in this case to be able to program intermediate resistance levels between the different crystalline and amorphous states of the phase-change material used. The intermediate resistance levels are obtained for example by causing a different distribution between the quantities of material in the amorphous phase and in the crystalline phase.

This approach is confronted however with the difficulty of being able to obtain, within the context of an industrial manufacturing process, devices capable of being programmed reproducibly and stably in a large number of applications and environments in which they are liable to be used. In the case of phase-change resistive memories, it is indeed particularly difficult to be able to obtain memory cells which, once programmed to a given level of resistance, will maintain this level of resistance over time. It has indeed been observed that the phase-change material often evolves over time, bringing about a variation in its resistance which was defined during programming. Now, from the moment that the resistances programmed undergo drift, it may become difficult or even impossible to distinguish between the different resistance levels, which is particular problematic when a memory cell is required to be able to store more than two resistance levels. Indeed, for the same resistance value initially programmed, the reading device may be able to interpret the data contained in the memory cell in one way (01 for example) before drift and interpret the data contained in the memory cell differently (10 for example) after significant drift. In such cases, reading of the data contained in the memory cell is incorrect.

One of the aims of the present invention is therefore to describe a memory cell structure with resistivity change that solves at least any one of these problems. A particularly advantageous application involves being able to store and read in a manner stable over time two bits of data in the same memory cell.

The other objects, characteristics and advantages of the present invention will appear during analysis of the following description and the accompanying drawings. It is understood that other advantages may be incorporated.

SUMMARY

An aspect of the present invention is a non-volatile memory cell comprising a resistivity change material configured to reversibly change state between at least two stable states having different electrical resistances and conformed such that transformation from one state to another is obtained by controlling the temperature increase or decrease of the resistivity change material, wherein the resistivity change material has an ohmic component Ron-mat defined by the ratio between an increment in the programming voltage $V_{prog}$ causing an increment in a programming current $I_{prog}$, wherein the memory cell is characterised in that the resistivity change material has a non-ohmic component defined by a maintenance voltage $V_h$ (240) such that $V_h$ (240) is:

greater than zero when the programming voltage $I_{prog}$ passes through the resistivity change material;

greater than an ohmic voltage equal to $R_{on-mat} \times I_{prog}$.

Consequently, the resistivity change material has an ohmic component defined by the resistance $R_{on-mat}$. This resistance is defined by the slope of a curve formed by the programming voltage $V_{prog}$ as a function of a programming current $I_{prog}$.

The programming voltage $V_{prog}$ and the programming current $I_{prog}$ are respectively the voltage at the terminals of the resistivity change material and the current passed through the resistivity change material during a programming phase, i.e. during a phase in which a change of state of the resistivity change material is induced.

The resistivity change material is likewise characterised by a second property in that it displays a maintenance voltage $V_h$ greater than zero when the programming current $I_{prog}$ passes through it. This second property is termed the non-ohmic component.

Finally, the resistivity change material is likewise characterised by the fact that the voltage of the maintenance voltage $V_h$ is greater than the programming current $I_{prog}$ multiplied by the resistance $R_{on-mat}$. The product of the programming current $I_{prog}$ times the resistance $R_{on-mat}$ is known as the ohmic voltage.

When the programming current $I_{prog}$ passes through the resistivity change material, the ohmic component provides a thermal power $R_{on-mat} \times I_{prog}^2$ and the non-ohmic component defined by the maintenance voltage $V_h$ provides a thermal power $V_h \times I_{prog}$. The ohmic and non-ohmic components therefore each make a contribution to the thermal power generated by the resistivity change material when programming current $I_{prog}$ passes through the latter.

The thermal power $V_h \times I_{prog}$ provided by the non-ohmic component is greater than the thermal power $R_{on-mat} \times I_{prog}^2$ contributed by the non-ohmic component.

Preferably, the contribution of the thermal power $V_h \times I_{prog}$ provided by the non-ohmic component is twice the thermal power $R_{on-mat} \times I_{prog}^2$ contributed by the ohmic component.

Consequently, it is the current supplied to the resistivity change material that causes heating within the latter. The heating of the layer of resistivity change material takes place in the centre of the latter. In the known solutions, the heating mainly primarily occurs at the contact zone between the heater and the layer of resistivity change material.

It is a fact that the drift of the resistance value over time has proven to be closely related to the resistance value. The higher the programming resistance values, the greater their drift. By allowing programming of different resistance levels at lower resistance values, the invention thereby makes it possible to reduce the drifts. In a particularly advantageous manner, the invention therefore allows improvement of the reliability over time of the data contained in a memory cell designed to store at least two bits of data.

Another aspect of the invention concerns a non-volatile memory cell comprising a resistivity change material configured to reversibly change state between at least two stable states having different electrical resistances, wherein the resistivity change material is an alloy (GeTe) of germanium (Ge) and tellurium (Te) doped with nitrogen (N). Preferably, the nitrogen (N) doping of the GeTe alloy is greater than 5%. Advantageously, the nitrogen doping (N) of the GeTe alloy is within a range of between 9% and 20%. Even more advantageously, the nitrogen (N) doping of the alloy (GeTe) of germanium (Ge) and tellurium (Te) is on the order of 10%.

Another aspect of the invention concerns a non-volatile electronic memory comprising a number of memory cells according to any of the above characteristics.

According to another aspect, the invention relates to a method for programming a memory cell according to any of the above characteristics, characterised in that a programming current $I_{prog}$ is passed into the memory cell and that the thermal power $V_h \times I_{prog}$ is greater than the thermal power $R_{on-mat} \times I_{prog}^2$.

Another aspect of the invention concerns use of a memory cell according to the invention wherein the memory cell is programmed such as to store at least two bits of data. The memory cell is therefore used for multi-level.

BRIEF DESCRIPTION OF THE FIGURES

The aims and objects in addition to the characteristics and advantages of the invention will be better apparent from the detailed description of an embodiment of the latter, which is illustrated by the following accompanying drawings in which.

Figure 1:
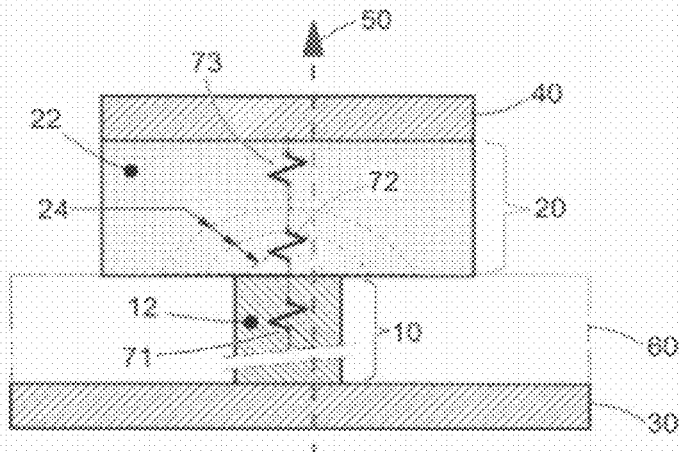
FIG. 1 illustrates a resistive phase-change memory of the prior art.

The enclosed drawings are provided by way of examples and are not limitative of the invention.

DETAILED DESCRIPTION OF THE INVENTION

Before describing the invention in detail, one of its aspects is reiterated and non-limitative but nevertheless advantageous characteristics are subsequently mentioned. Therefore, by way of a reminder, an aspect of the present invention is a non-volatile memory cell comprising a resistivity change material configured to reversibly change state between at least two stable states having different electrical resistances and conformed such that transformation from one state to another is obtained by controlling the temperature increase or decrease of the resistivity change material, wherein the resistivity change material has an ohmic component $R_{on-mat}$ defined by the ratio between an increment in the programming voltage $V_{prog}$ causing an increment in a programming current $I_{prog}$, wherein the memory cell is characterised in that the resistivity change material has a non-ohmic component defined by a maintenance voltage $V_h$ such that $V_h$ is:

greater than zero when the programming voltage $I_{prog}$ passes through the resistivity change material;

greater than an ohmic voltage equal to $R_{on-mat} \times I_{prog}$.

The invention may optionally display at least any one of the following advantageous and optional characteristics:

Preferably, the maintenance voltage $V_h$ is twice the ohmic voltage $R_{on-mat} \times I_{prog}$.

The maintenance voltage $V_h$, in a diagram representing the programming current $I_{prog}$ measured as a function of the programming voltage $V_{prog}$ applied, is the value of the voltage at the intersection of the plot of the programming currents $I_{prog}$ measured with the abscissa of the programming voltages $V_{prog}$ applied.

The resistivity change material has a voltage $V_h$ greater than 0.2 volts

Advantageously, the memory cell is connected to electronic circuits configured to control the memory cell, wherein the resistivity change material has a maintenance voltage $V_h$ less than a supply voltage Vdd of the electronic circuits controlling the memory cell. The supply voltage Vdd is typically 1.8 volts.

The resistivity change material is an alloy (GeTe) of germanium (Ge) and tellurium (Te) doped with nitrogen (N). Preferably, the nitrogen (N) doping of the GeTe alloy is greater than 9%. Advantageously, the nitrogen doping (N) of the GeTe alloy is within a range of between 9% and 20%. Even more advantageously, the nitrogen (N) doping of the alloy (GeTe) of germanium (Ge) and tellurium (Te) is on the order of 10%.

Within the context of the present invention, x % doping of the GeTe alloy with a doping agent implies that the quantity of doping agent in this material is x %. The measurement may be obtained through a RBS-NRA which stands for Rutherford backscattering spectrometry-nuclear reaction analysis.

According to a particularly advantageous embodiment, the resistivity change material is directly in contact with at least one conductive electrode. Preferably, the resistivity change material is directly in contact with two conductive electrodes. None of the electrodes forms a heater.

Consequently, this type of memory cell does not comprise any heaters. The resistivity change material forms its own heater. No additional heater is devoted to transferring heat to the resistivity change material.

This structure is of particularly limited size and level of complexity. The integration density of these cells is therefore improved.

According to another advantageous embodiment, the memory cell comprises at least one heater separate from the resistivity change material, configured to generate heat when a current passes through it and conformed to transfer this heat, at least in part, to the resistivity change material, such as to make a thermal contribution to heating the resistivity change material. This current is the programming current $I_{prog}$.

Typically, the heater is in direct contact with the phase-change material. The heat is mainly transferred from the heater to the phase-change material by thermal conduction.

The heater is configured such that its thermal contribution to heating the resistivity change material is less than the contribution of the thermal power $V_h \times I_{prog}$ provided by the non-ohmic component of the resistivity change material. Consequently, the thermal contribution generated by the resistivity change material is greater than the thermal contribution made by the heater.

Preferably, the heater and the resistivity change material are such that:

$$(V_h \times A \times \rho_{th\text{-}mat\,res} \times t_{mat\,res} \times K_{W\text{-}F} \times T/(t_{heater}^2 \times I_{prog}))^{1/2} > \rho_{el\text{-}heat}$$

Where
- A is the active area of the heater. More precisely, this area is defined by the contact zone between the heater and the resistivity change material.
- $\rho_{th\text{-}mat\,res}$ is the thermal resistivity of the resistivity change material.
- $t_{mat\,res}$ is the thickness of the resistivity change material.
- $K_{w\text{-}F}$ is the Widemann-Franz constant, equal to: 2.44 e-8 $W\Omega K^{-2}$.
- T is the absolute temperature of the fusion process of the resistivity change material.
- $t_{heater}$ is the thickness of the heater.
- $\rho_{el\text{-}heat}$ is the electrical resistivity of the heater.

More precisely, the heater and the resistivity change material are such that:

$$(V_h \times A \times \rho_{th\text{-}mat\,res} \times t_{mat\,res} \times K_{w\text{-}F} \times T/(t_{heater}^2 \times I_{prog}))^{1/2} > 2 \times \rho_{el\text{-}heat}$$

Advantageously, the heater and the resistivity change material are such that:

$$V_h \times I_{prog} \times t_{th\text{-}mat\,res} \times t_{mat\,res}/A > 10 R_{el\text{-}heat} \times I_{prog}^2 \times \rho_{th\text{-}heater} \times t_{heater}/A$$

Where
- $\rho_{th\text{-}mat\,res}$ is the thermal resistivity of the resistivity change material.
- $t_{mat\,res}$ is the thickness of the resistivity change material.
- A is the active area of the heater.
- $R_{el\text{-}heat}$ is the electrical resistance of the material of the heater.
- $\rho_{th\text{-}heat}$ is the thermal resistivity of the material of the heater.
- $t_{heater}$ is the thickness of the heater.

The heating means has a resistance such that its thermal contribution to heating the resistivity change material provides less than 50% of the contribution of the thermal power $V_h \times I_{prog}$ supplied by the non-ohmic component of the resistivity change material.

Advantageously, the heater includes tungsten.

According to an advantageous embodiment, the resistivity change material forms a layer. It may in this case comprise a block of the same material.

According to an advantageous embodiment, the heater comprises a hollow body. It may have a roughly circular annular shape in cross-section. According to a specific embodiment, the resistivity change material may prolong the heater. Preferably, it may display an annual shape, the section of which is roughly identical to that of the heater.

According to a privileged embodiment, the resistivity change material is a phase-change material. It is conformed to have an amorphous phase in a first state and a crystalline phase in at least a second state.

FIG. 1 describes a resistive phase-change memory of the prior art. This type of cell is characterised by the presence of a heater 10, one end of which is directly in contact with a layer 20 formed of a phase-change material 22. The phase-change material is typically a chalcogenide, particularly an alloy of germanium (Ge), antimony (Sb) and tellurium (Te) known under the acronym of GST, the chemical composition of which is: $Ge_2Sb_2Te_5$. The heater 10 is generally buried in a layer 60 of an insulator, typically silicon oxide (SiO2).

During a programming phase of the memory cell, using means not illustrated which are not necessary for understanding of the invention, a current 50 is circulated between the conductive electrodes, lower 30 and upper 40, of the cell via the heater 10 and the layer 20 of the phase-change material. The heater 10 is formed of an electrically resistant material 12. This will be typically titanium nitride (TiN). Passage of the current 50 causes heating of the heater 10 and of a zone 24 of the layer 20 of the phase-change material which is directly in contact with the heater 10. The layer 20 of the phase-change material is heated initially at least by heat transfer, by conduction, from the heater 10 to the layer 20 of the phase-change material. Typically, the entire layer 20 of the phase-change material is initially in a low-resistivity crystalline phase or has been restored to this state before programming of the memory point. Passage of the current through the heater with a view to programming the memory cell results in this case, as represented in FIG. 1, transformation of a more or less broad zone 24 of the layer 20 into a high resistivity amorphous phase. Owing to the shape of the amorphous zone produced in this manner above the pillar formed by the heater, this type of cell is often known as a mushroom cell in the technical literature on these subjects.

Restoration to the crystalline phase of the layer of phase-change material and transformation into an amorphous phase of the zone in contact with the heater call on known methods and procedures. Typically, current pulses 50 controlled in amplitude, duration and shape are generated allowing evolution within each of the cells of a memory of the phase-change material between its different states by controlling its heating and cooling. A conventional method is briefly described in the following figure.

Figure 2:
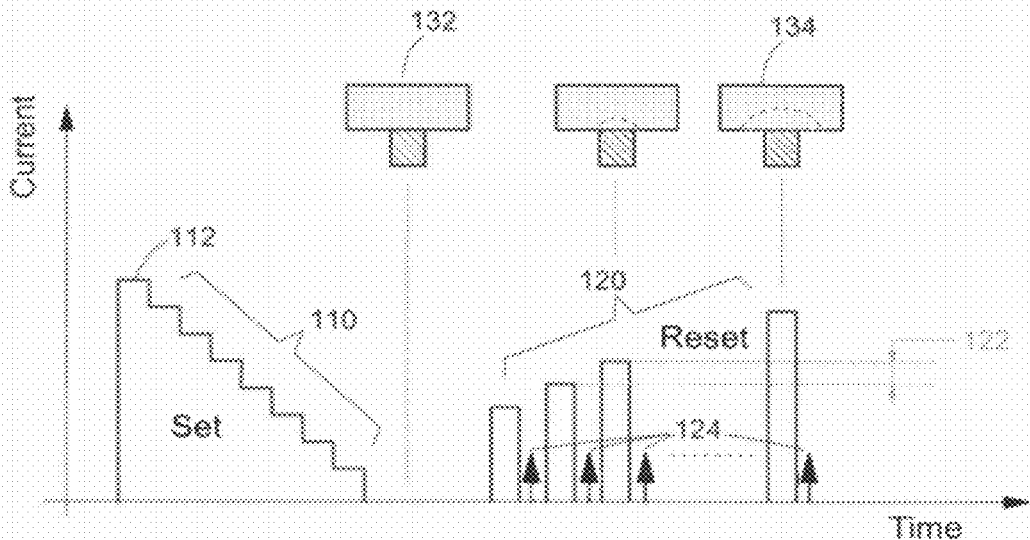
FIG. 2 describes how programming of a resistive phase-change memory is performed.

By way of example, FIG. 2 diagrammatically represents how programming of a memory cell as described in the above figure is obtained.

The layer 20 of phase-change material is initially restored to its crystalline state, either by performing an appropriate thermal pre-treatment in order to completely crystallise the phase-change material, or by applying a descending sequence of current levels. The aim of this sequence is to gradually cool the material to cause its crystallisation once it has been liquefied by the first high intensity level 112. It is to be noted that in the technical literature concerning phase-change memories, restoration of the crystalline state of the material is known as "set". Transformation into the amorphous state of all or part of the material is called "reset", or zeroing. These terms are borrowed from English and are commonly used without translation to denote two predetermined states of a logical circuit and here, by analogy, to designate the two main phases of the phase-change material.

Programming of a specific resistive state is subsequently commonly performed by successive approximations using a series of writings 120 whereby the current 122 is increased at each test. Each of the writings is followed by a verification 124 of the resistance obtained after cooling until the anticipated resistance is obtained. This technique is often denoted by the acronym WAV "write-and-verify". The cell therefore progresses form a state in which the material has become completely crystalline 132 following the set operation 110, until a growth 134 in the amorphous zone is obtained during successive resets, allowing the desired resistance value to be obtained.

With the structure of the memory cell in FIG. 1, programming of several resistance levels proves extremely delicate however in practice. It is noted that the amorphous zone which forms in contact with the heater 10, i.e. the "corolla of the mushroom" 24 completely closes the conduction path which the heater 10 also forms as soon as this zone develops somewhat. In reading, the resistive model is that of resistances arranged in series as shown diagrammatically in FIG. 1. It is formed of three resistances: the resistance of the heater 71 itself, the resistance of the amorphous zone 72 and the resistance of the zone of the phase-change material which has remained crystalline 73 and is therefore very weakly resistive. It is of course the resistance of the amorphous zone 72, as soon as it develops during programming, which very rapidly becomes predominant. A sudden increase in the reading resistance is observed in this case, which only allows, at best, programming of several levels at high resistance values. It has become apparent that high resistances present two major disadvantages: on the one hand, a significant drift over time in the value of these resistances is observed, which no longer allows them to be reliably distinguished during reading and therefore precisely determine the initially memorised level. On the other hand, reading of a very low current level, resulting from programming of a high resistance value, is always more difficult, calls for a more sophisticated reading circuit and takes more time.

The invention frees itself from the problems outlined above and describes in the following figures a structure of a phase-change memory cell allowing more particularly programming of much lower resistance values, which are easily readable and reproducible and which ensure stable functioning over time, allowing effective implementation, within the context of an industrial process, of the multi-level non-volatile memory cells.

Within the context of the present invention, the resistivity change material is a material conformed to switch from one stable resistive state to another stable resistive state, wherein each state has a different resistivity. With each state being stable, when the material is transformed into a given state, it remain in this state, unless subject to deliberate modification and drifts which one seeks to avoid and displays in this case the resistivity specific to this state.

Transformation from one state to another is typically performed by controlling the temperature increase or decrease of the resistivity change material.

Typically, the resistivity change material may be a phase-change material. In a first state, the material is in an amorphous phase. In a second stage, the material is in a crystalline phase. Such a material therefore has at least two stable resistive states displaying different resistivities. Possibly in another further state, the material is in another further crystalline phase. In this case it displays another further resistivity. According to an embodiment, the invention concerns a phase-change memory. This type of memory is usually known as a PCM, the acronym of "phase-change memory".

Figure 3:
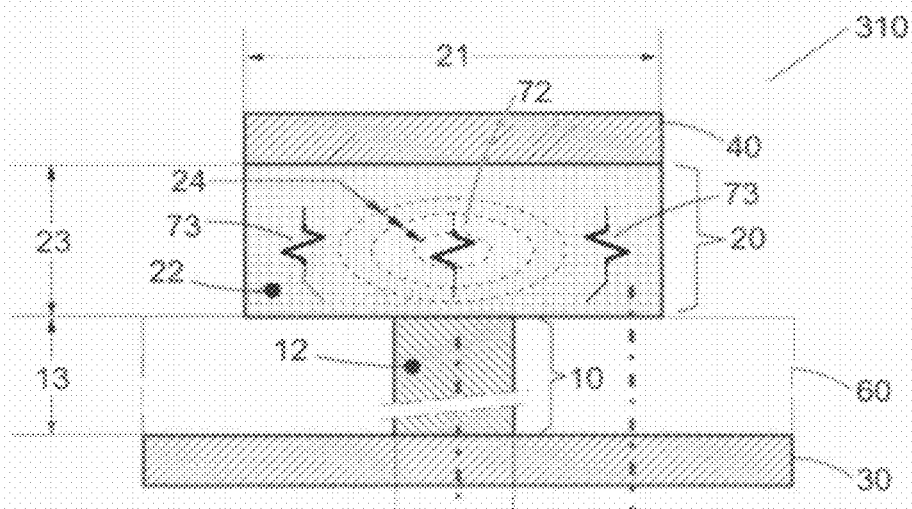
FIG. 3 illustrates an example of a memory cell according to the invention and describes its functioning.

FIG. 3 illustrates an example of a memory cell 310 according to the invention which, although it does not significantly differ from the geometric structure of a cell of the prior art represented in FIG. 1, it differs completely however by the choice of its materials and by the way in which the amorphous zone 24 is formed in the layer 20 of the resistivity change material.

As illustrated in this figure, the growth of the amorphous zone 24, during the reset operations 120 used to program the resistance value, occurs within the layer 20 itself and no longer in contact with the heater 10.

This result is obtained on the one hand by using a specific resistivity change material 22 different from the GST mentioned above, the composition and properties of which are described below and in the following figures. Formation of the amorphous zone within the layer 20 is obtained on the one hand by transforming the heater 10 into a simple electrode conducting the programming current. The material 12 forming it must be a good conductor of electricity and must undergo little heating, or none at all, when the programming current passes through it. Tungsten (W) for example offers particularly good results.

In this new method of functioning, the power supplied by the programming current is essentially dissipated in the centre of the layer 20 of the resistivity change material 22. The independent heater 10 is no longer essential. It is the layer of the resistivity change material which is self-heating, as will be seen below.

The resistive model in writing which results is very different from the serial model illustrated in FIG. 1 by resistances 71, 72 and 73. A parallel model is involved in this case. The resistance 71 of the conductor 10 has become negligible. The resistance 73 of the material which has remained crystalline and that 72 of the material which has become amorphous are combined in parallel and low resistance values can be programmed since in this case, there is no longer immediate closure of the conduction path as in the structure of the prior art.

Figure 4:
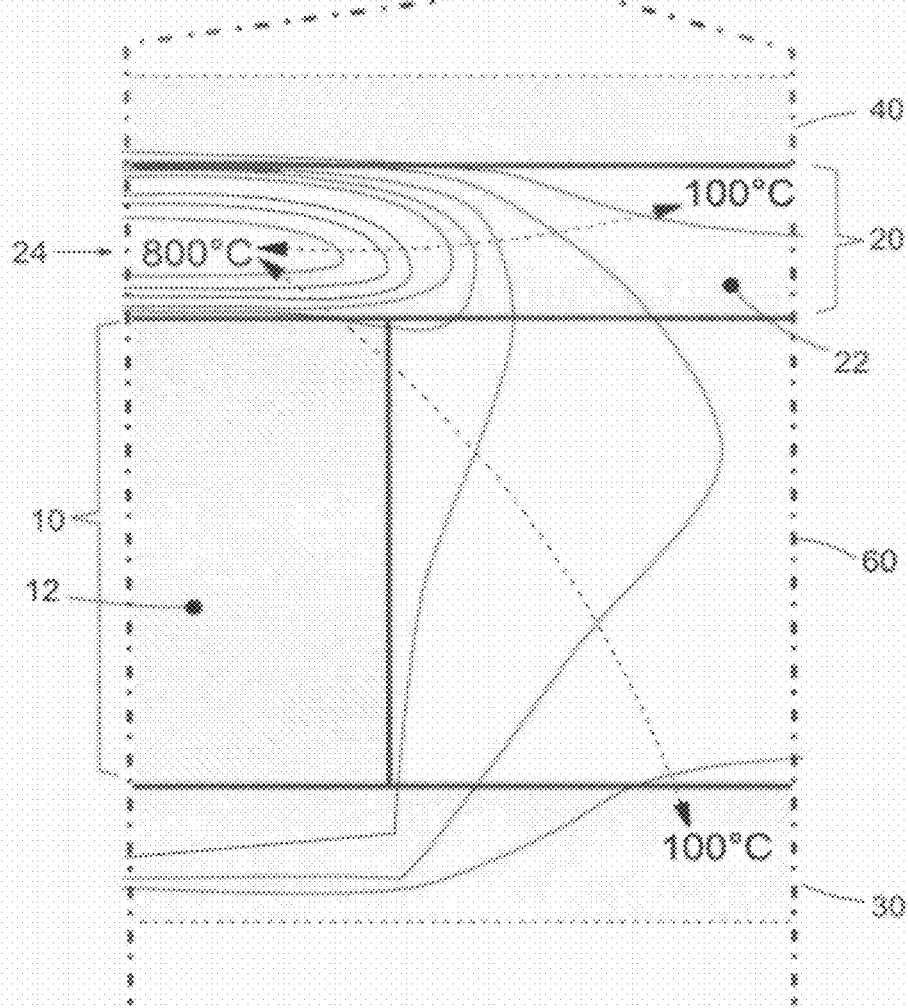
FIG. 4 shows a chart of the temperatures within a memory cell according to the invention during programming of a resistance level.

FIG. 4 is the result of a simulation and shows the chart of the temperatures within the device of FIG. 3 during programming of a resistance level during a reset operation. It is observed that the temperature maximum, on the order of 800° C. in this example, indeed occurs within the layer 20 of the resistivity change material to form the amorphous zone 24 above the conductive electrode 10 which previously served as the heater.

Simulations and experiments were conducted on a device as described in FIG. 3, the dimensions and materials use of which were as follows:

diameter 11 of the cylinder of the conductive electrode 10 made of tungsten: 300 nm (nanometre=$10^{-9}$ metre);

height 13 of the tungsten cylinder: 300 nm;

diameter 21 of the top electrode 40 and of the layer 20 of the resistivity change material 22: 3 microns (micron=$10^{-6}$ metre);

thickness 23 of the layer 20 of the resistivity change material: 100 nm. The layer of the resistivity change material of the invention is formed of an alloy of germanium (Ge) and tellurium (Te) doped with nitrogen (N) at a rate of 10%. GeTeN10% is noted below.

It should be commented that the dimensions mentioned above for the experimental device used for implementation of the invention remain without prejudice to the dimensions of the devices which may benefit from the invention. Furthermore, since the layer of the resistivity change material used by the invention is self-heating, presence of a separate heater 10 that has little or no resistivity is no longer strictly necessary. The structure of the memory cell may advantageously be simplified as in the example of FIG. 9 below.

Furthermore, within the context of the present invention, doping of the GeTe with nitrogen is not limited to 10% even though such doping has proved particularly advantageous. Particularly good results were also recorded for doping values ranging from 9% to 20%. It was demonstrated that a too low value of the doping does not allow having a gradual transition in the resistance values which it is possible to program.

Figure 5:
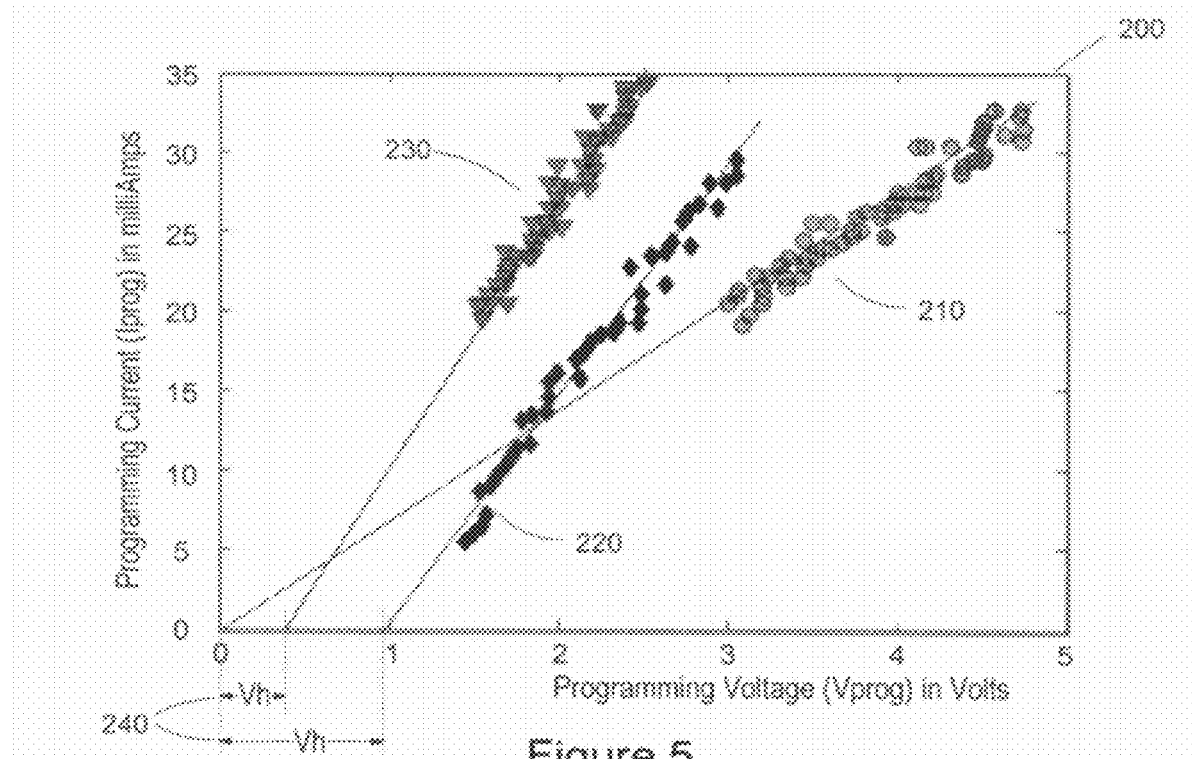
FIG. 5 illustrates the behaviour of an example of self-heating resistivity change material used by the invention during programming and compares it with other resistivity change materials.

FIG. 5 illustrates the behaviour of an example of resistivity change material used by the invention, GeTeN10%, during programming and compares it with other resistivity change materials.

FIG. 5 is a diagram 200 showing experimental results measured on a device such that that in FIG. 3 for three resistivity change materials forming the layer 20. This allows comparison of the material advocated by the invention, i.e. GeTeN10%, with two other materials: on the one hand, the same alloy of germanium and tellurium GeTe but not doped and on the other hand, the material most commonly used to produce resistivity change memories, i.e. GST which has already been mentioned and discussed above. The diagram shows as the ordinate the programming current $I_{prog}$ measured as a function of the programming voltage $V_{prog}$ applied to the terminals of the device for the three materials mentioned above.

In the current-voltage diagram (IV) in FIG. 5, the curve 210 corresponds to the case of GeTe and it is noticed that the behaviour of the layer 20 in this case corresponds to that of a conventional resistance obeying Ohm's Law: the current is strictly proportional to the voltage applied. The plot of the points measured may be continued to pass through the origin of the diagram.

In contrast, the two other materials, i.e. the material advocated by the invention, GeTeN10% 230 and GST 220 each have strongly non-ohmic behaviour which may be characterised by their voltage $V_h$ 240. $V_h$ is known as the maintenance voltage. It is greater than zero and corresponds to the extension of the plot of the points measures to its intersection with the abscissa of the diagram. These two materials and possibly another resistivity change material, particularly those of the chalcogenide type, which display the same non-ohmic behaviour, may be used for implementation of the invention under the conditions discussed below, in combination with a low-resistance heater or even without a separate heater as will be seen in FIG. 8.

It should be noted here that plotting of the current-voltage curves in FIG. 5, intended to characterise the resistivity change materials capable of being used, is preferably performed by producing a test device with the corresponding material, as that in FIG. 3. The programming current is indeed measured during the duration of the programming pulse when the material starts to be liquefied by passage of the programming current $I_{prog}$ resulting from application of an adequate voltage $V_{prog}$.

Obtaining the results described above in FIGS. 3 and 4 with a resistivity change material having a non-ohmic behaviour as shown in FIG. 5 requires however that the two criteria discussed below, based on the one hand on the characteristics of the heater and on the other hand on those of the resistivity change material, be fulfilled in order to produce a multi-level memory. That is to say, a memory wherein it is actually possible to reproducibly program multiple levels of resistances stable over time and readily readable and which therefore implies, as already seen, that a range of low resistances can be programmed.

One first criterion is that the heater 10 must behave rather more as a conveyor of power than as an actual heater of the resistivity change material. That is to say, the overall increase in temperature ΔT, during the programming current pulses, is maximised in the resistivity change material ($\Delta T_{chalco}$) in relation to the increase in temperature of the heater ($\Delta T_{heater}$) and of that of the top contact electrode 40. In order to obtain this result, a maximum resistance value of the heater as a function of that of the resistivity change material is determined as follows, knowing that:

P is the power dissipated by the current pulses.

$R_{th-mat\ res}$ is the thermal resistance of the resistivity change material.

$R_{th-heat}$ is the thermal resistance of the heater material.

$V_h$ is the maintenance voltage of this material as already defined above.

$I_{prog}$ is the programming current assessed at the start of amorphisation when it begins to increased the resistance in the graphs R-I $\rho_{th-heat}$ is the thermal resistivity of the material of the heater.

$\rho_{th-mat\ res}$ is the thermal resistivity of the resistivity change material.

$\rho_{el-mat\ res}$ is the electrical resistivity of the resistivity change material 22.

$\rho_{el-heat}$ is the electrical resistivity of the material of the heater.

$t_{heater}$ is the thickness 13 of the heater.

$t_{mat\ res}$ is the thickness 23 of the resistivity change material 22.

A is the active area which is approximately that which corresponds to the diameter 11 of the heater. In a more general sense, this area corresponds to the contact between the heater and the resistivity change material. This area may for example be measured on a cross-section using a scanning electron microscope or a transmission electron microscope.

Figure 8:
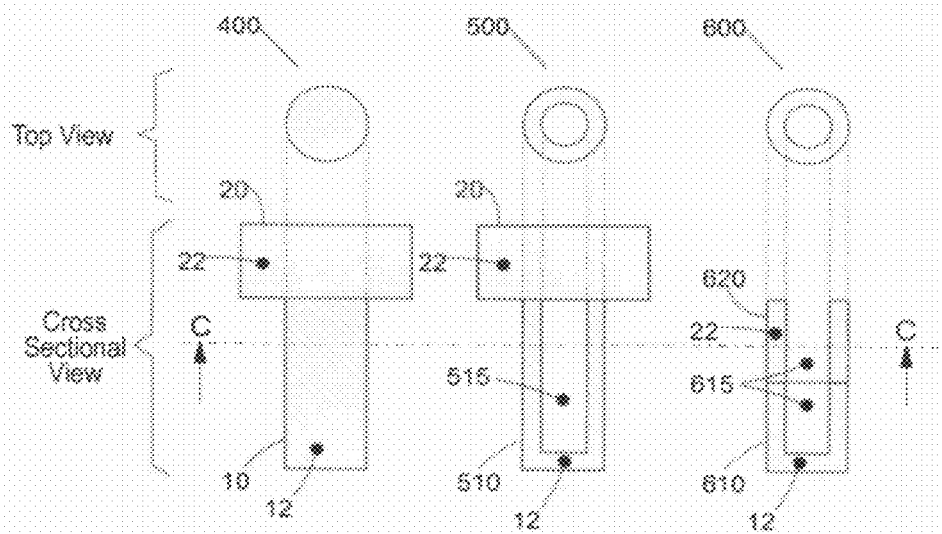
FIG. 8 illustrates examples of memory cells according to the invention, with each of the memory cells being seen in longitudinal section and in cross-section at the level of the heater or the resistivity change material.

In the examples illustrated in FIG. 8, each of the cross-sectional views of the cells 400, 500, 600 defines an active area.

$R_{el-mat\ res}$ is the electrical resistance of the resistivity change material 22.

$R_{el-heat}$ is the electrical resistance of the material of the heater.

$K_{W-F}$ is the Widemann-Franz constant, equal to: 2.44 e-8 $W\Omega K^{-2}$.

T is the absolute temperature of the fusion process of the resistivity change material 22. More specifically, this is the fusion temperature of the resistivity change material and may be measured using different methods. For example, the method known as differential thermal analysis may be used. One may also use the so-called differential scanning calorimetry method.

The values $R_{th-mat\ res}$, $R_{th-heat}$, $R_{el-mat\ res}$, $R_{el-heat}$, $\rho_{th-heat}$, $\rho_{th-mat\ res}$, $\rho_{el-mat\ res}$, $\rho_{el-heat}$ are preferably assessed or measured around the same temperature. This temperature is preferably a temperature of change of state, corresponding for example to transformation from an amorphous to a crystalline state. In practice, it may correspond to the programming temperature.

$P_{mat\ res} \times R_{th-mat\ res}$ is greater than or indeed very great with regard to: $P_{heater} \times R_{th-heater}$; which implies that:

$$V_h \times I_{prog} \times \rho_{th-mat\ res} \times t_{mat\ res}/A$$

or also very great with regard to:

$$R_{el-heat} \times I_{prog}^2 \times \rho_{th-heater} \times t_{heater}/A$$

Typically, $V_h \times I_{prog} \times \rho_{th-mat\ res} \times t_{mat\ res}/A$ is at least greater than $R_{el-heat} \times I_{prog}^2 \times \rho_{th-heater} \times t_{heater}/A$. Preferably, $V_h \times I_{prog} \times \rho_{th-mat\ res} \times t_{mat\ res}/A$ is at least two times greater than $R_{el-heat} \times I_{prog}^2 \times \rho_{th-heater} \times t_{heater}/A$ $$V_h \times I_{prog} \times \rho_{th-mat\ res} \times t_{mat\ res}/A$$

is very great with regard to:

$$\rho_{el\text{-}heat} \times t_{heater}/A \times I_{prog}^2 \times \rho_{th\text{-}heater} \times t_{heater}/A$$

Preferably, $V_h \times I_{prog} \times \rho_{th\text{-}mat\ res} \times t_{mat\ res}/A$ is at least 10 times greater than:

$$\rho_{el\text{-}heat} \times t_{heater}/A \times I_{prog}^2 \times \rho_{th\text{-}heater} \times t_{heater}/A$$

$\rho_{el\text{-}heat}$ is very small with regard to and typically at least 10 times smaller than:

$$V_h \times A \times \rho_{th\text{-}mat\ res} \times t_{mat\ res}/(t_{heater}^2 \times I_{prog} \times \rho_{th\text{-}heater})$$

or furthermore that $\rho_{el\text{-}heat}$ is very small with regard to:

$$(V_h \times A \times \rho_{th\text{-}mat\ res} \times t_{mat\ res} \times K_{W\text{-}F} \times T/(t_{heater}^2 \times I_{prog}))^{1/2}$$

It should be noted here that the dissipated power in the resistivity change material mainly depends on the maintenance voltage $V_h$ as will be seen with the second criterion below. Furthermore, the Widemann-Franz law, i.e.: $\rho_{th} = \rho_{el}/(K_{W\text{-}F} \times T)$, which is valid for metals indeed applies in the case of the invention which advantageously uses a metallic heater such as the tungsten previously mentioned.

The second criterion relates to the resistivity change material itself which must be highly self-heating. It must display behaviour of the type shown by curves 220 and 230 in FIG. 5 in order to allow the power dissipated within it to be mainly non-ohmic and therefore essentially depends on the maintenance voltage $V_h$. In this case, $P_{mat\ res}$ will be able to be different from: $V_h \times I_{prog}$ and therefore depend little on its ohmic component: $R_{on\text{-}mat} \times I_{prog}^2$. $R_{on\text{-}mat}$ is the resistance of the material in the conductive state during programming. This is the derivative of the curves in FIG. 5, i.e. their slope. Preferably and advantageously, the resistance $R_{on\text{-}mat}$ is deduced from the curves taking account of the serial resistances of the means of access to the layer of resistivity change material. These values are known for the test device used and are subtracted from the values measured. This criterion therefore allows qualification of the resistivity change materials by specifying that the non-ohmic portion of the power dissipated in the material, i.e. $V_h \times I_{prog}$, is great in relation to the ohmic component: $R_{on\text{-}mat} \times I_{prog}^2$. Typically, $V_h \times I_{prog}$ is at least greater than 1 times $R_{on\text{-}mat} \times I_{prog}^2$. Preferably, $V_h \times I_{prog}$ is at least greater than twice $R_{on\text{-}mat} \times I_{prog}^2$.

It is also possible to qualify the resistivity change materials used in the cells according to the invention by the fact that $V_h$ must be great in relation to $R_{on\text{-}mat} \times I_{prog}$. As already stated, $I_{prog}$ is assessed at the start of amorphisation.

Any value of $V_h$ significantly greater than zero is suitable. Advantageously, the value of $V_h$ will however remain less than the supply voltage (Vdd) of the circuits controlling the memory points. Typically, the supply voltage Vdd of the integrated circuits is currently 1.8 volts and represents an upper practical limit for $V_h$. In order to be able to apply programming voltages corresponding to the values $V_{prog}$ appearing as the abscissas in FIG. 5 for the different materials involved, voltages which may be greater than the supply voltage mentioned above, one may resort to specialised voltage raising circuits of the diode pump type.

Figure 6:
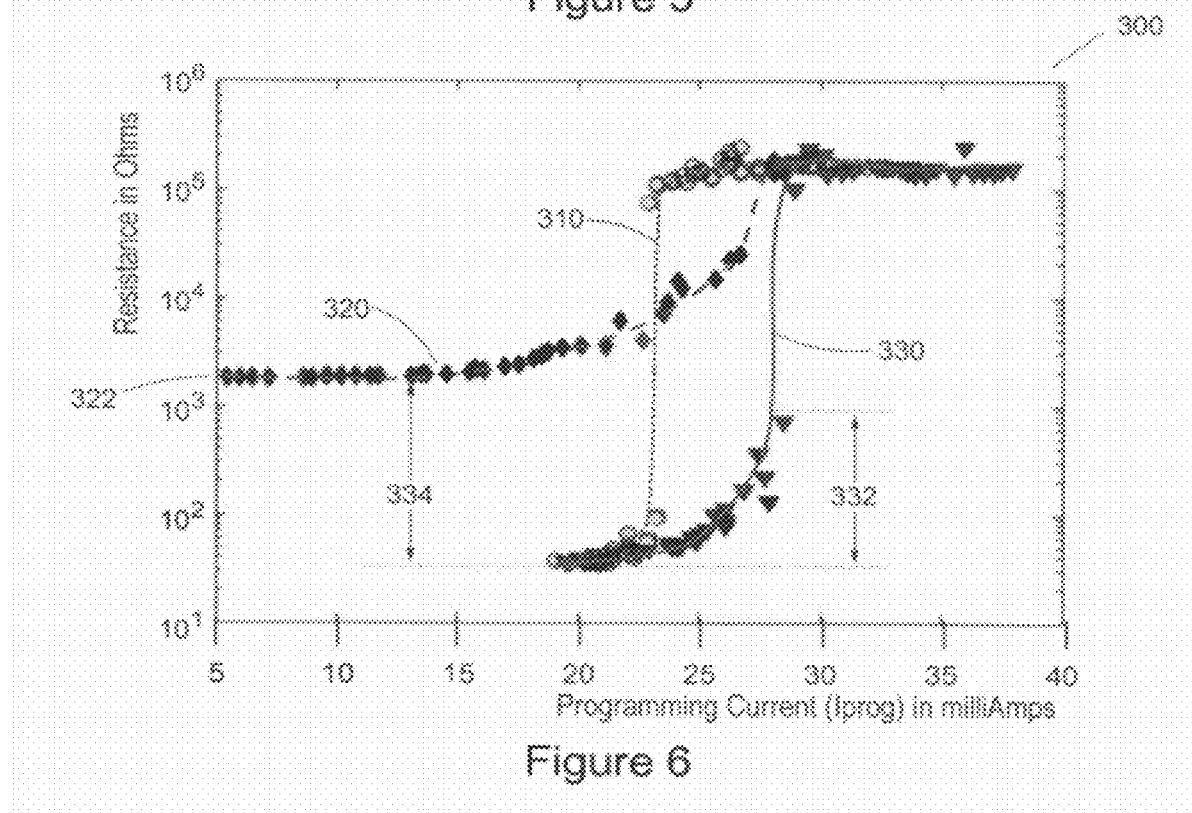
FIG. 6 compares the results obtained in terms of resistance levels which it is possible to program in order to produce a multi-level memory cell.

FIG. 6 compares the results obtained with the above materials in terms of resistance levels which it is possible to program in order to produce a multi-level memory cell.

FIG. 6 shows a diagram 300 with as ordinates typical resistance values obtained for the three materials as a function of the value of the pulse of programming current observed during a reset operation such as that described in FIG. 2.

In the light of this diagram, it is absolutely clear that GeTe 310 is not suitable for the reasons discussed above, since the transition between the low and high resistance values is particularly sudden.

GST 320 shows as anticipated, owing to its non-ohmic behaviour, a much more gradual transition in the resistance values which it is possible to program starting however from an initial value 322 which is relatively high in this case. It will be noted here that the initial resistance value is that of the layer of crystalline material for a device corresponding to that in FIG. 3 and that the final value corresponds to a case in which the amorphous zone 24 has become sufficiently wide in order to prevent passage of the reading current corresponding to the resistances 73 in FIG. 3. It will also be noted that the reading must be performed at voltages and currents that are sufficiently low in order to avoid inducing any significant heating of the material, which would of course be liable to modify the value thereof. Typically, it is performed at very low values, for example 50 millivolts.

The material advocated by the invention, i.e. GeTeN10% 330, indeed offers a broad adjustment range 332, greater than an order of magnitude, of the resistance values which can be programmed in the cell; furthermore, at a level of resistance two orders of magnitude less 334 than that of GST.

It is therefore readily possible to program different low resistance levels using this material which will not be liable to drift over time. Furthermore, these resistance levels can be measured in reading with higher currents, which guarantees rapid measurement times with a measurement circuit that remains simple.

Figure 7:
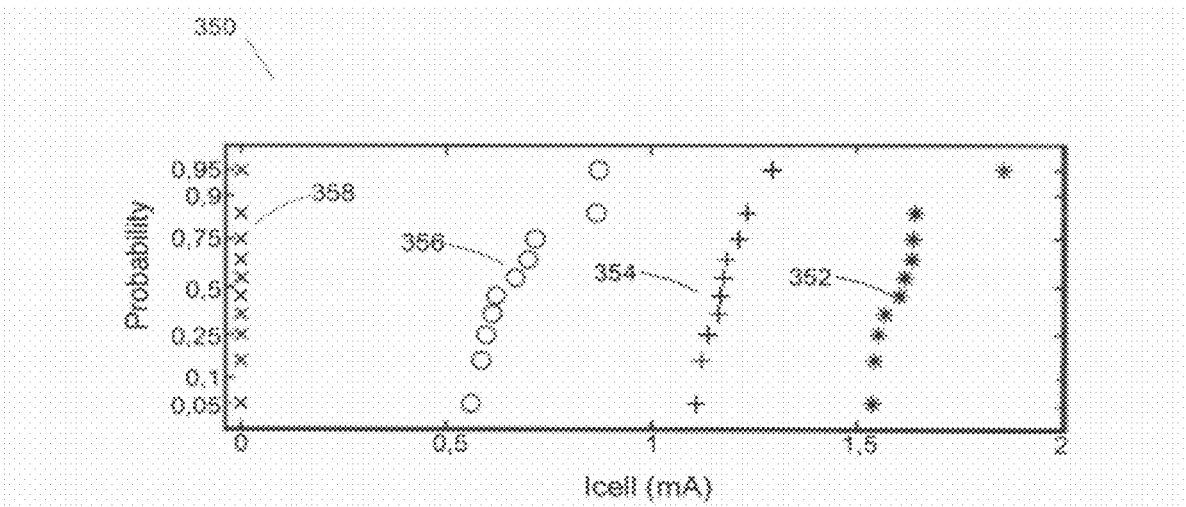
FIG. 7 illustrates the multiple levels of resistances that can be programmed with a device according to the invention.

FIG. 7 illustrates the multiple levels of resistances that can be programmed with a device according to the invention. The diagram shows as the ordinate the static dispersion observed for the reading currents (Icell) of samples of multi-level memory cells manufactured using GeTeN10% and having a structure corresponding to FIG. 3. It was possible to program four resistance levels of increasing value: 352, 354, 356 and 358 in this example which, as has been seen, doubles the capacity of the memory point by allowing storage of two bits of data at the latter. The first three resistance levels are low, on the order of 65 ohms, 90 ohms and 180 ohms respectively. They are therefore not liable to appreciably drift over time, thereby guaranteeing that the reader will always be able to differentiate between them unambiguously at a sufficiently high reading current level, typically within a current range on the order of two milliamperes in this example, in order to avoid having to implement a sophisticated reader which would inevitably affect reading speed. The highest level of resistance 358 on the order of 100 kiloohms corresponds to a case in which amorphisation of the change material is complete and the cell has become essentially non-conductive. The current in this case is almost zero and can always be easily distinguished from the other resistance values programmed.

FIG. 8 illustrates three examples 400, 500 and 600 of memory cells according to the invention, with each of the memory cells being seen in cross-section at a level C of the heater or the resistivity change material and in longitudinal section.

The memory cell 400 has a heater 12 in the form of a solid bar similar to the structure used to illustrate the invention in the previous figures. The top and bottom electrodes are not illustrated. It will be noted here that the heater 10, which according to the invention is made of a low-resistivity or non-resistive material 12, may also advantageously serves as a bottom contact electrode with the block 20 of resistivity change material 22. In the example illustrated, the heater 10 forms a cylindrical pillar. Its section therefore forms a disc. Any other geometrical shape may however be used: square, rectangle, polygon, etc. The resistivity change material 22 forms a block 20 or a layer in contact with the heater 10. The body of the heater may form a contact electrode of the bottom contact electrode type.

The memory cells 500 and 600 each have a heater, 510 and 610 respectively, including a tubular section body. This body is preferably annular in shape. It may also be rectangular, polygonal, or square. Preferably, another material 515, 615 is arranged inside the heater, generally an oxide serving as insulation. The section may form a ring as illustrated, or any other geometrical shape, square, rectangle, polygon, etc. Therefore, the memory cell comprises a body within which an oxide is arranged. The body of the heater may form a contact electrode of the bottom contact electrode type.

The memory cell 600 also has a heater 610, tubular in section, which is in contact with the contact electrode. The resistivity change material 22 prolongs the heater 610 in this embodiment. If the latter is tubular in section, the resistivity change material 22 is also tubular in section. In the example illustrated, the section of the resistivity change material 22 and of the heater 12 is roughly identical, at least at their contact zone. It is annular in shape.

Preferentially, the inside of the body of the heater 610 and of the resistivity change material 22 are filled with an oxide 615 as described above.

The self-heating resistivity change material used for the structures 500 and 600 are those advocated by the invention, regardless of their geometric shape.

Electrodes not illustrated are connected to these cells.

The structures 500 and 600 allow a reduction in the current and therefore the power required for amorphisation of the resistivity change material 22.

For example, with the structure 500, the size of the amorphisation region on contact with the heater is smaller than with the structure 400. This region forms a ring and not a disc, which allows limitation of the current.

Furthermore, with the structure 600, the current is concentrated within a smaller active volume, which likewise concentrates the power necessary for programming the memory cell. This result is obtained even though the thermal insulation of the resistivity change material may prove less good than with the structure 500, since the oxide 615 near the amorphisation region may have a thermal conductivity greater than that of the resistivity change material.

The invention therefore allows reproducible and stable programming of memory cells. In addition, it facilitates reading of these cells and simplifies their structure.

Figure 9:
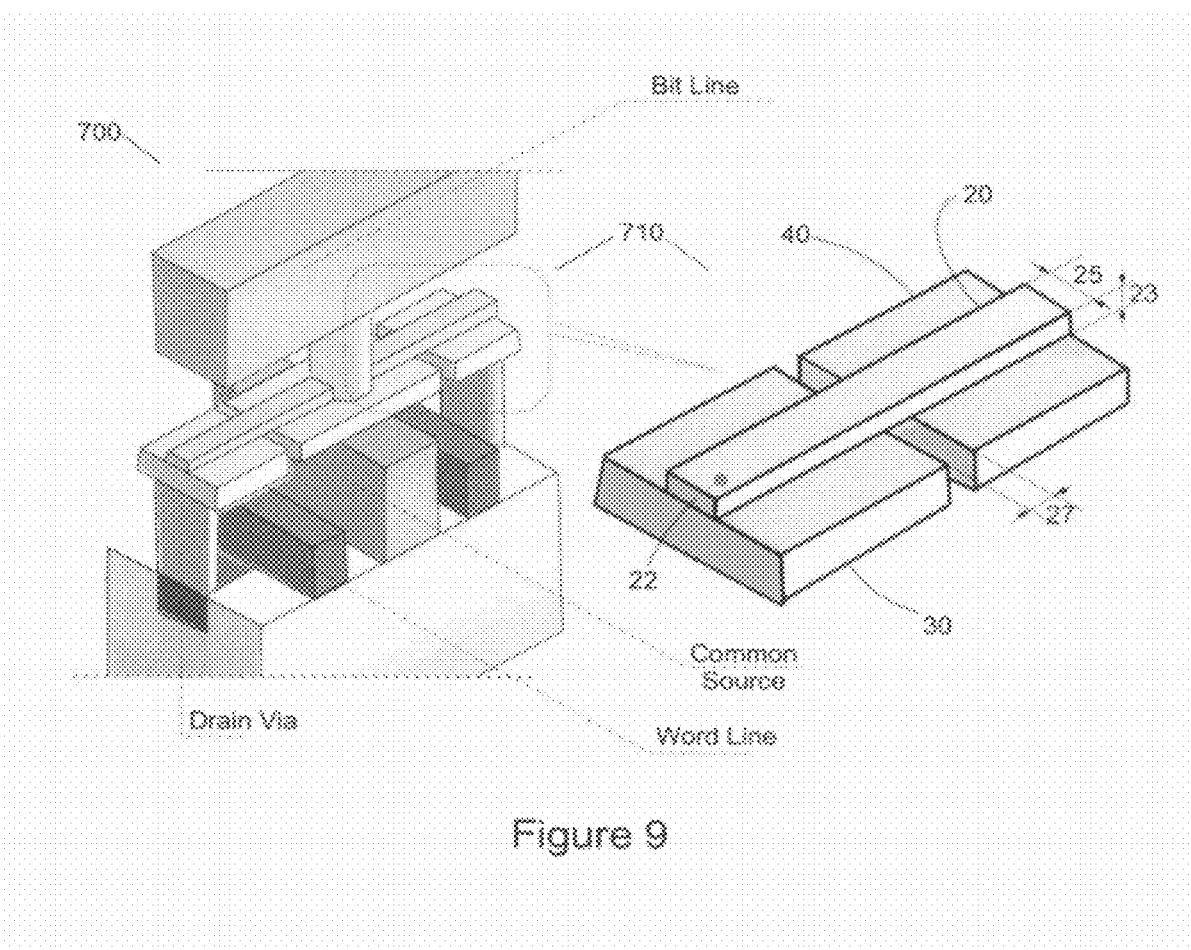
FIG. 9 illustrates another example of a memory cell according to the invention not comprising a separate heater of the resistivity changer material.

FIG. 9 illustrates another example of a memory cell 710 using the principle of the invention consisting of having a resistivity change material 22 that is also self-heating. No separate heater is provided for in this embodiment. All the characteristics mentioned above concerning the resistivity change material apply to this embodiment. In particular, the relationship between the ohmic and non-ohmic components applies to this embodiment.

The conductive electrodes 30 and 40 providing access to the memory device are directly placed in contact with the resistivity change material which adopts the form of a bar 20 of thickness 23 in this case. The electrodes play a perfectly symmetrical role and may be reversed. The bar 20 of self-heating resistivity change material forms a "bridge" between the two electrodes. The horizontal dimensions of the bridge, 25 and 27, are defined in this case by lithography, which allows this type of memory point to be able to control the critical dimensions of the device and potentially be able to benefit from all the improvements regularly made to this technique with a view to increasing the density of the circuits produced.

Having become extremely simple in structure, the memory cell 710 of the invention may subsequently be effectively incorporated in a highly dense matrix organisation of the type used to produce high capacity memories. The structure 700 represents an example thereof. Each memory point is located at the intersection of two selection lines conventionally known as "bit line" and "word line" which allow individual addressing of each memory point. In this example, two memory cells have a common electrode, known in this case as the "source". The other electrode is known as the drain. Programming of the different levels and reading of the stored levels is subsequently performed as explained above by selecting the memory cells in the matrix using the lines above.

The invention is not limited to the examples described and applies to any embodiment in keeping with its spirit.

Furthermore, some of the features of the exemplary embodiments of this invention may be used to advantage without the corresponding use of other features. As such, the foregoing description should be considered as merely illustrative of the principles, teachings and embodiments of this invention, and not in limitation thereof.

The invention claimed is:

1. A non-volatile memory cell comprising a resistivity change material configured to reversibly change state between at least two stable states having different electrical resistances and conformed such that transformation from one state to another is obtained by controlling the temperature increase or decrease of the resistivity change material, wherein the resistivity change material has an ohmic component $R_{on\text{-}mat}$ defined by the ratio between an increment in the programming voltage $V_{prog}$ causing an increment in a programming current $I_{prog}$, wherein the resistivity change material has a non-ohmic component defined by a maintenance voltage $V_h$ such that $V_h$ is:

greater than zero when the programming voltage $I_{prog}$ passes through the resistivity change material; and greater than an ohmic voltage equal to $R_{on\text{-}mat} \times I_{prog}$.

2. A memory cell according to claim 1, in which the maintenance voltage $V_h$ is at least twice the ohmic voltage $R_{on\text{-}mat} \times I_{prog}$.

3. A memory cell according to claim 1, in which the maintenance voltage $V_h$, in a diagram representing the programming current $I_{prog}$ measured as a function of the programming voltage $V_{prog}$ applied, is the value of the voltage at the intersection of the plot of the programming currents $I_{prog}$ measured with the abscissa of the programming voltage $V_{prog}$ applied.

4. A memory cell according to claim 1, in which the resistivity change material has a maintenance voltage $V_h$ greater than 0.2 volts.

5. A memory cell according to claim 1, wherein the memory cell is connected to electronic circuits configured to control the memory cell and wherein the resistivity change material has a maintenance voltage $V_h$ less than a supply voltage Vdd of the electronic circuits controlling the memory cell.

6. A memory cell according to claim 5 in which the supply voltage Vdd is 1.8 volts.

7. A memory cell according to claim 1, wherein the resistivity change material is an alloy (GeTe) of germanium (Ge) and tellurium (Te) doped with nitrogen (N).

8. A memory cell according to claim 7 wherein the nitrogen (N) doping of the GeTe alloy is within a range of 9% to 20%.

9. A memory cell according to claim 8 wherein the nitrogen (N) doping of the alloy (GeTe) of germanium (Ge) and tellurium (Te) is 10%.

10. A memory cell according to claim 1, wherein the resistivity change material is directly in contact with at least two conductive electrodes.

11. A memory cell according to claim 1, comprising at least one heater separate from the resistivity change material, configured to generate heat when a current passes through said heater and conformed to transfer this heat, at least in part, to the resistivity change material, such as to make a thermal contribution to heating the resistivity change material.

12. A memory cell according to claim 11, wherein the heater is configured such that its thermal contribution to heating the resistivity change material is less than the thermal power $V_h \times I_{prog}$.

13. A memory cell according to claim 11, wherein the heater and the resistivity change material are such that:

$$(V_h \times A \times \rho_{th\text{-}mat\text{-}res} \times t_{mat\,res} \times K_{W\text{-}F} \times T/(t_{heater}^2 \times I_{prog}))^{1/2} > \rho_{el\text{-}heat}$$

where

A is the active area of the heater, $\rho_{th\text{-}mat\ res}$ is the thermal resistivity of the resistivity change material, $t_{mat\,res}$ is the thickness of the resistivity change material, $K_{W\text{-}F}$ is the Widemann-Franz constant, equal to: $2.44e\text{-}8\ W\Omega K^{-2}$, T is the absolute temperature of the fusion process of the resistivity change material, $t_{heater}$ is the thickness of the heater, $\rho_{el\text{-}heat}$ is the electrical resistivity of the heater.

14. A memory cell according to claim 13, wherein the heater and the resistivity change material are such that:

$$(V_h \times A \times \rho_{th\text{-}mat\,res} \times t_{mat\,res} \times K_{W\text{-}F} \times T/(t_{heater}^2 \times I_{prog}))^{1/2} > 2 \times \rho_{el\text{-}heat}$$

15. A memory cell according to claim 11 wherein the heater and the resistivity change material are such that:

$$V_h \times I_{prog} \times \rho_{th\text{-}mat\,res} \times t_{mat\,res}/A > 10 \times R_{el\text{-}heat} \times I_{prog}^2 \times \rho_{th\text{-}heater} \times t_{heater}/A$$

Where $\rho_{th\text{-}mat\,res}$ is the thermal resistivity of the resistivity change material, $t_{mat\,res}$ is the thickness of the resistivity change material, A is the active area of the heater, $R_{el\text{-}heat}$ is the electrical resistance of the heater, $\rho_{th\text{-}heat}$ is the thermal resistivity of the material of the heater, $t_{heater}$ is the thickness (13) of the heater.

16. A memory cell according to claim 11 wherein the heater includes tungsten.

17. A memory cell according to claim 11 wherein the resistivity change material forms a layer.

18. A memory cell according to claim 11 wherein the heater comprises a block of the same material.

19. A memory cell according claim 11 wherein the heater comprises a hollow body.

20. A memory cell according to claim 19, wherein the heater displays an annular shape in cross-section.

21. A memory cell according to claim 19, wherein the heater forms a cavity housing an electrically insulating material.

22. A memory cell (600) according to claim 19, wherein the resistivity change material prolongs the heater.

23. A memory cell according to claim 19, wherein the resistivity change material displays an annular shape, the section of which is roughly identical to that of the heater.

24. A non-volatile electronic memory comprising a number of memory cells according to claim 11.

25. A method for programming a memory cell according to claim 11, said method comprising passing a programming current $I_{prog}$ into the memory cell and wherein the thermal power $V_h \times I_{prog}$ is greater than the thermal power $R_{on\text{-}mat} \times I_{prog}^2$.

26. A method of storing data, comprising providing a memory cell according to claim 11, said method comprising programming the memory cell such as to store at least two bits of data.

* * * * *